US010078103B2

United States Patent
Zhong et al.

(10) Patent No.: US 10,078,103 B2
(45) Date of Patent: Sep. 18, 2018

(54) FRINGING FIELD BOOSTER

(71) Applicant: Microsoft Technology Licensing, LLC, Redmond, WA (US)

(72) Inventors: Wenkai Zhong, Bellevue, WA (US); Sean R. Mercer, Issaquah, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 64 days.

(21) Appl. No.: 15/248,184

(22) Filed: Aug. 26, 2016

(65) Prior Publication Data
US 2018/0059158 A1    Mar. 1, 2018

(51) Int. Cl.
*G01R 27/26* (2006.01)
*H03K 17/945* (2006.01)
*H04B 1/3827* (2015.01)
*G01V 3/02* (2006.01)

(52) U.S. Cl.
CPC ........... *G01R 27/2605* (2013.01); *G01V 3/02* (2013.01); *H03K 17/945* (2013.01); *H04B 1/3833* (2013.01)

(58) Field of Classification Search
CPC ............................... G01V 3/02; H03K 17/945
USPC .............................. 324/76.11, 658, 109, 457
See application file for complete search history.

(56) References Cited

U.S. PATENT DOCUMENTS

| 7,656,392 | B2 | 2/2010 | Bolender |
| 8,432,322 | B2 | 4/2013 | Amm et al. |
| 2003/0112021 | A1* | 6/2003 | Palata ................ G01R 27/2605 324/658 |
| 2004/0178924 | A1 | 9/2004 | Gifford et al. |
| 2008/0122456 | A1 | 5/2008 | Moon et al. |
| 2010/0026656 | A1 | 2/2010 | Hotelling et al. |
| 2013/0033400 | A1* | 2/2013 | Chiang .................... H01Q 1/44 343/700 MS |
| 2013/0050046 | A1* | 2/2013 | Jarvis ..................... H01Q 1/243 343/852 |
| 2013/0293244 | A1* | 11/2013 | Leek ....................... G06F 3/046 324/630 |
| 2015/0029137 | A1* | 1/2015 | Cheng ..................... G06F 3/044 345/174 |
| 2015/0077391 | A1 | 3/2015 | Bertrand |
| 2015/0145805 | A1 | 5/2015 | Liu |
| 2015/0199042 | A1 | 7/2015 | Standing et al. |
| 2015/0200444 | A1 | 7/2015 | Mercer et al. |

OTHER PUBLICATIONS

Toit, Riaan Du, "Capacitive sensing in battery-powered devices—Design considerations", Published on: Aug. 11, 2014, Available at: http://www.edn.com/design/sensors/4433304/Capacitive-sensing-in-battery-powered-devices-Design-considerations.

(Continued)

*Primary Examiner* — Christopher Mahoney

(74) *Attorney, Agent, or Firm* — Holzer Patel Drennan

(57) ABSTRACT

The described technology includes an apparatus comprising a proximity sensor pad and booster element located between an antenna and the proximity sensor pad, wherein voltage level of the booster element at least ten percent higher than voltage level of the proximity sensor pad. Implementations of the booster element may be made of metal or metal-ink and may have U-shape or L-shape.

20 Claims, 13 Drawing Sheets

(56) References Cited

OTHER PUBLICATIONS

"Capacitive Proximity Sensors", Published on: Oct. 14, 2013, Available at: http://www.ab.com/en/epub/catalogs/12772/6543185/12041221/12041231/print.html.
Osoinach, Bryce, "Proximity Capacitive Sensor Technology for Touch Sensing Applications", In Proximity Sensing White Paper, Mar. 13, 2012, 12 pages.

* cited by examiner

FRINGING FIELD BOOSTER

BACKGROUND

Computing devices have been developed to increase the functionality that is made available to users in a variety of settings. For example, a user may interact with a mobile phone, tablet computer, or other computing device to check email, surf the web, compose texts, interact with applications, and so on. Modern computing devices may incorporate multiple antennas to support various wireless subsystems and communications. The multiple antennas may include for example, one or more cellular, Wi-Fi, Bluetooth, and/or near field communication (NFC) antennas.

SUMMARY

The described technology includes an apparatus comprising a proximity sensor pad and booster element located between an antenna and the proximity sensor pad, wherein voltage level of the booster element at least ten percent higher than voltage level of the proximity sensor pad. Implementations of the booster element may be made of metal or metal-ink and may have U-shape or L-shape.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Other implementations are also described and recited herein.

BRIEF DESCRIPTIONS OF THE DRAWINGS

DETAILED DESCRIPTIONS

In electrostatic devices like a parallel plate capacitor, fringing field represents leakage and loss, which are not desired. However, for electrostatic applications like the proximity sensors in cellular phones and tablets, fringing field which represents the field escaping the product chassis and reaching out is the more useful field interacting with a proximity object, such as human body.

In a proximity sensor design, a sensing metal pad is placed at a proper location near the product chassis ground. Sensor circuits apply a direct current (DC) voltage between the sensor pad and chassis ground. This voltage creates electrostatic fields, which consist of fields contained within the product form factor (local fields), and fields escaping the product form factor (fringing field). The fringing fields are useful for detecting presence of a proximity object such as a human body.

Figure 1:
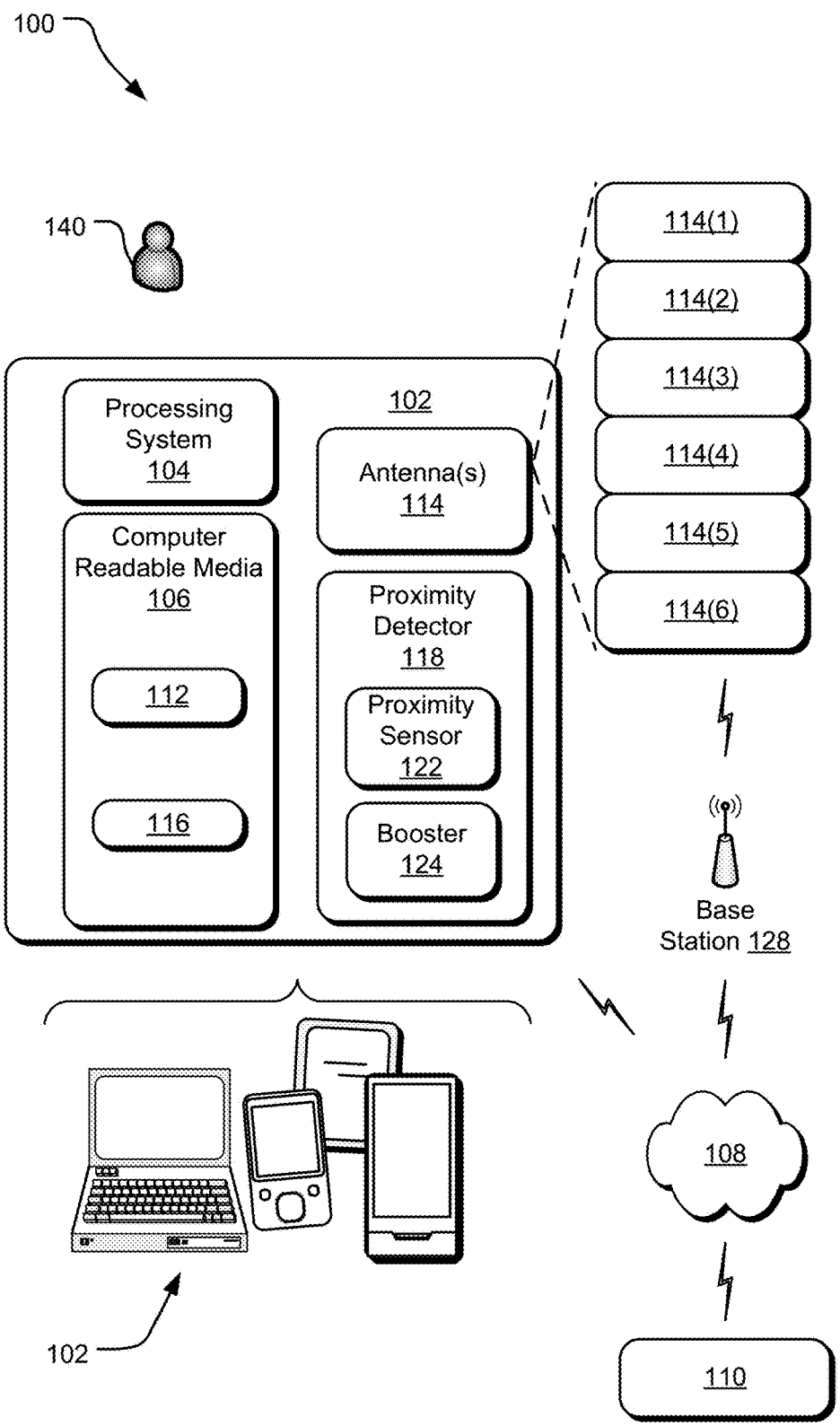
FIG. 1 is an illustration of an environment in an example implementation that is operable to employ the techniques described herein.

FIG. 1 is an illustration of an environment 100 in an example implementation that is operable to employ the techniques described herein. The illustrated environment 100 includes an example of a computing device 102 that includes a processing system 104 and computer-readable media 106 that are representative of various different types and combinations of processing components, media, memory, and storage components and/or devices that may be associated with a computing device and employed to provide a wide range of device functionality. In at least some implementations, the processing system 104 and computer-readable media 106 represent processing power and memory/storage that may be employed for general purpose computing operations. More generally, the computing device 102 may be configured as any suitable computing system and/or device that employ various processing systems and computer-readable media to implement functionality described herein.

The computing device 102 may be configured in a variety of ways. For example, the computing device 102 may be configured as a mobile computing device for mobile use as illustrated, such as a mobile phone, a tablet computer, a laptop, a portable media device, and so on. The computing device 102 may range from a full resource device with substantial memory and processor resources to a low-resource device with limited memory and/or processing resources. The computing device 102 may also relate to software that causes the computing device 102 to perform one or more operations.

The computing device 102 may further be communicatively coupled over a network 108 to a service provider 110. The service provider 110 may be configured to make various resources (e.g. content and services) available over the network 108 to the computing device 102 and other clients. Generally, resources made accessible by a service provider 110 may include any suitable combination of services and/or content typically made available over a network by one or more providers. Some examples of services include, but are not limited to, cellular communication service, Internet data service, navigation service, a search service, an email service, an instant messaging service, an online productivity suite, and an authentication service to control access of clients to the resources, to name a few examples. Content may include various combinations of text, multi-media streams, documents, application files, photos, audio/video files, animations, images, web pages, web applications, device applications, content for display by a browser or other client applications, and the like.

As further illustrated in FIG. 1, the computing device 102 may include various applications 112, one or more antennas 114(x) to provide various wireless communication functionality, a specific absorption rate (SAR) manager module 116 operable to control the antennas for SAR compliance, and one or more proximity detectors 118 to supply user presence indications and/or user proximity measurements with respect to the antennas. A variety of applications 112 that provide different functionality to the device may be provided on some form of computer-readable media and may be executed via the processing system 104. Some examples of applications 112 typically associated with computing devices include, but are not limited to, an operating system, a productivity suite that integrates multiple office productivity modules, a web browser, games, a multi-media player, a word processor, a spreadsheet program, a photo manager, and so forth.

The one or more antennas 114(x) are representative of various antennas employed by the computing device to implement wireless functionality, subsystems, and communications. The antennas 114(x) may communicate with the network 108 via a base station 128. In accordance with techniques described herein, the antennas may include multiple different kinds of antennas (e.g., radios) that are arranged together within one or more antennas zones established for the computing device. In general, the antennas may be placed to minimize interference between antennas and/or achieve performance objectives for the suite of antennas as a whole. A variety of different types of antennas, combinations of different types of antennas, and arrangements of antennas are contemplated. For example, the antennas 114(x) may include one or more cellular 114(1) antennas, Wi-Fi 114(2) antennas, global navigation satellite system (GNSS) 114(3) antennas, Near Field Communication (NFC) 114(4) antennas, Bluetooth 114(5) antennas, and/or other 114(6) antennas. In accordance with techniques described herein, the antennas 114(x) may include multiple antennas that may be interdependent upon one another and/or are arranged/designed in combination. In some scenarios, some wireless technologies may be implemented using two or more individual radios/antennas.

For instance, the Wi-Fi 114(2) antennas may employ a two-by-two multiple input/multiple output configuration (e.g., 2×2 MIMO). The Wi-Fi 114(2) antennas may include at least a main and a MIMO antenna in some configurations. In addition, a Bluetooth 114(5) antenna may optionally be combined with the Wi-Fi 114(2) antennas. Further, modern cellular technologies such as Long Term Evolution (LTE), WiMax, and/or 4G may employ two or more cellular 114(1) antennas, such as a main cellular 114(1) antenna and a MIMO cellular antenna and cover various frequencies, bands, geographic areas, and so forth. The GNSS 114(3) antennas may be configured for use with various types of navigation standards, technologies, and systems including but not limited to GPS, GLONASS, Galileo, and/or BeiDou navigation systems, to name some examples. A variety of different combinations of antennas including the example antennas as well as other types of antennas are contemplated.

The proximity detector 118 may be configured to detect presence of an object, such as a human body 140, proximal to the computing device 102. The information collected by the proximity detector 118 may be used to control the signal strength of the one or more antennas 114(x). Specifically, the proximity detector 118 may allow the computing device to intelligently modify the performance of the one or more antennas 114(x) to maintain SAR compliant with regulatory requirements while minimally perturbing antennas/radio operations. An example implementation of the proximity detector 118 may include a proximity sensor 122 and a booster 124. Various implementations of the proximity sensor 122 and the booster 124 are described in further detail herein.

The computing device 102 may have certain regions of its internal volume that are designated as "keep-out" zones, where the antennas 114(x) may not be located, thus restricting possible antenna volume. Alternatively, the antennas 114(x) are considered to have a "keep-out" zone (also referred to as keep-out area or, keep-out space) where various components of the computing device, such as mounting screws, traces, and other metallic objects should not be placed. In an implementation of the computing device 102, the booster 124 is located outside the keep-out zone of the antennas 114(x). Such a configuration may provide better reception performance by the proximity sensor 122 and reduced interferences in the antenna keep-out zone. For example, in one implementation, the booster 124 is a one arm booster that is located further away from the antennas 114(x), outside the keep-out zone of the antennas 114(x), and close to the metal chassis of the computing device 102. In alternative implementation, the booster 124 is a one arm booster that is located between the proximity sensor 122 and the metal chassis of the computing device 102.

Figure 2:
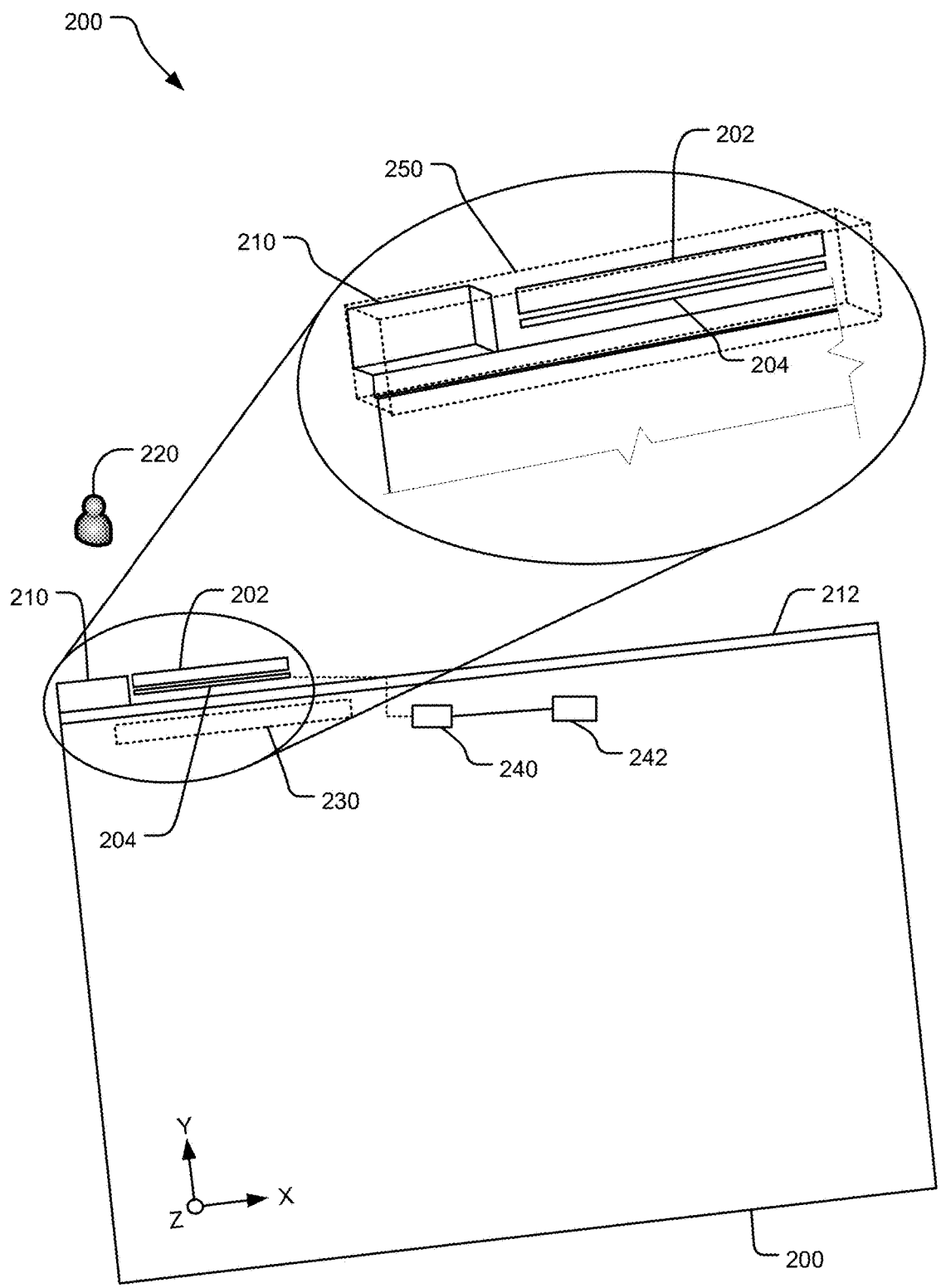
FIG. 2 illustrates an example fringing field booster for proximity sensing according to the technology disclosed herein.

FIG. 2 illustrates a computing device 200 with fringing field booster for proximity sensing according to the technology disclosed herein. Specifically, the computing device 200 may be a tablet computer that includes a radio frequency (RF) antenna 230 internal to the computing device 200. When an external object 220, such as human body, comes in proximity of the computing device 200, the radio frequency waves generated by the RF antenna 230 may adversely affect such external object 220. Therefore, the computing device 200 may also include a proximity sensor 202 that is configured to determine presence of such external object 220 near the computing device 200.

In one implementation, the proximity sensor 202 determines such presence of the external object 220 using a capacitive sensor chip. For example, such a capacitive sensor chip may have multiple output pins to drive multiple sensor pads, and each of the multiple sensor pads may have substantially similar voltage (both amplitude and timing) applied to them. The sensor pads may be made of metal and the metal sensor pad is placed at a proper location near the chassis ground of the computing device 200. The sensor circuit implemented by the sensor chip applies a DC voltage between the metal sensor pad and chassis ground of the computing device 200. In an alternative implementation, the sensor pads may be made of metal ink.

The computing device 200 further includes a booster 204. The booster 204 may include a metal booster pad. In an alternative implementation, the booster pads may be made of metal ink. In one implementation, the booster 204 has the same voltage as the voltage applied to it as the proximity sensor 202. However, in an alternative implementation, the voltage applied to the booster 204 is higher than the voltage on the proximity sensor 202. For example, the voltage applied to the booster 204 may be 50% higher than the voltage applied to the proximity sensor 202. Alternatively, the voltage applied to the booster 204 may be higher than the voltage applied to the proximity sensor 202 within a range of 10% to 200%.

The higher voltage level at the booster 204 results in increased range of the proximity sensor's 202 capability in detecting objects nearby the computing device 200. The higher voltage applied to the booster 204 may be achieved by connecting the booster 204 to a power source internal or external to the computing device 200 providing such higher voltage. Alternatively, a voltage booster converter circuitry 240 may be used that receives as its input the voltage from a power source 242 in the computing device 200 and outputs a higher voltage level. The output of the voltage boost converter circuitry 240 is connected to the booster 204.

Furthermore, the metal booster pad is DC insulated from the ground of the computing device 200. In one implementation, such ground of the computing device 200 may be implemented using a metal bucket deployed on the surface of the computing device 200. Thus, the booster 204 may be insulated from such metal bucket deployed on the surface of the computing device 200.

The computing device 200 may also include an anchor 210 that is configured at the rear left corner of the computing device 200. The anchor 210 may be made of metal or other rigid material that provides stability to the computing device 200. The proximity sensor 202 and the booster 204 may be implemented near a rear edge 212 of the computing device 200 near the anchor 210. Note that such placement of the proximity sensor 202 and the booster 204 may be based on location of an RF antenna 230 of the computing device 200. Thus, when the RF antenna 230 is placed (internal to the computing device 200) near the rear left corner, the proximity sensor 202 and the booster 204 may also be placed near the rear left corner.

However, in an alternative implementation, if the RF antenna 230 is placed (internal to the computing device 200) near the rear right corner, the proximity sensor 202 and the booster 204 may also be placed near the rear right corner. The booster 204 may be in the form of a rectangular arm that extends along a length of the proximity sensor 202 along the rear edge 212 (along x-direction) of the computing device 200.

The booster 204 manipulates interaction and the E field between a sensor pad of the proximity sensor 202 and ground of the computing device 200, such as a bucket ground such that the electromagnetic field ("E" field) of the proximity sensor 202 is boosted. In the illustrated implementation, the booster 204 has a shape of a rectangle. While the edges of the booster 204 along the x-direction are illustrated to be aligned with the edges of the proximity sensor 202 along the x-direction, in alternative implementation they may be non-aligned. Similarly, while the length of the booster 204 along the x-direction is substantially similar to the length of the proximity sensor 202 along the x-direction in the illustrated implementation, in an alternative implementation, they may be different from each other.

Furthermore, in the illustrated implementation, the booster 204 is located outside a keep-out zone 250 of the RF antenna 230. The keep-out zone 250 of the RF antenna 230 may be an area where generally no other metal conductors or ground traces may be located. In the illustrated implementation, the proximity sensor 202 and the booster 204 may be located near the bottom edge of the keep-out zone 250 as well as outside the keep-out zone 250.

For example, adding the booster 204 to the computing device 200 may increase the E field in the Y-direction by an additional 5-10 cm. Such increase in the E field may represent over fifty percent (50%) increase in the reach of the proximity sensor's 202 capability of detecting presence of the proximity object 230.

Figure 3:
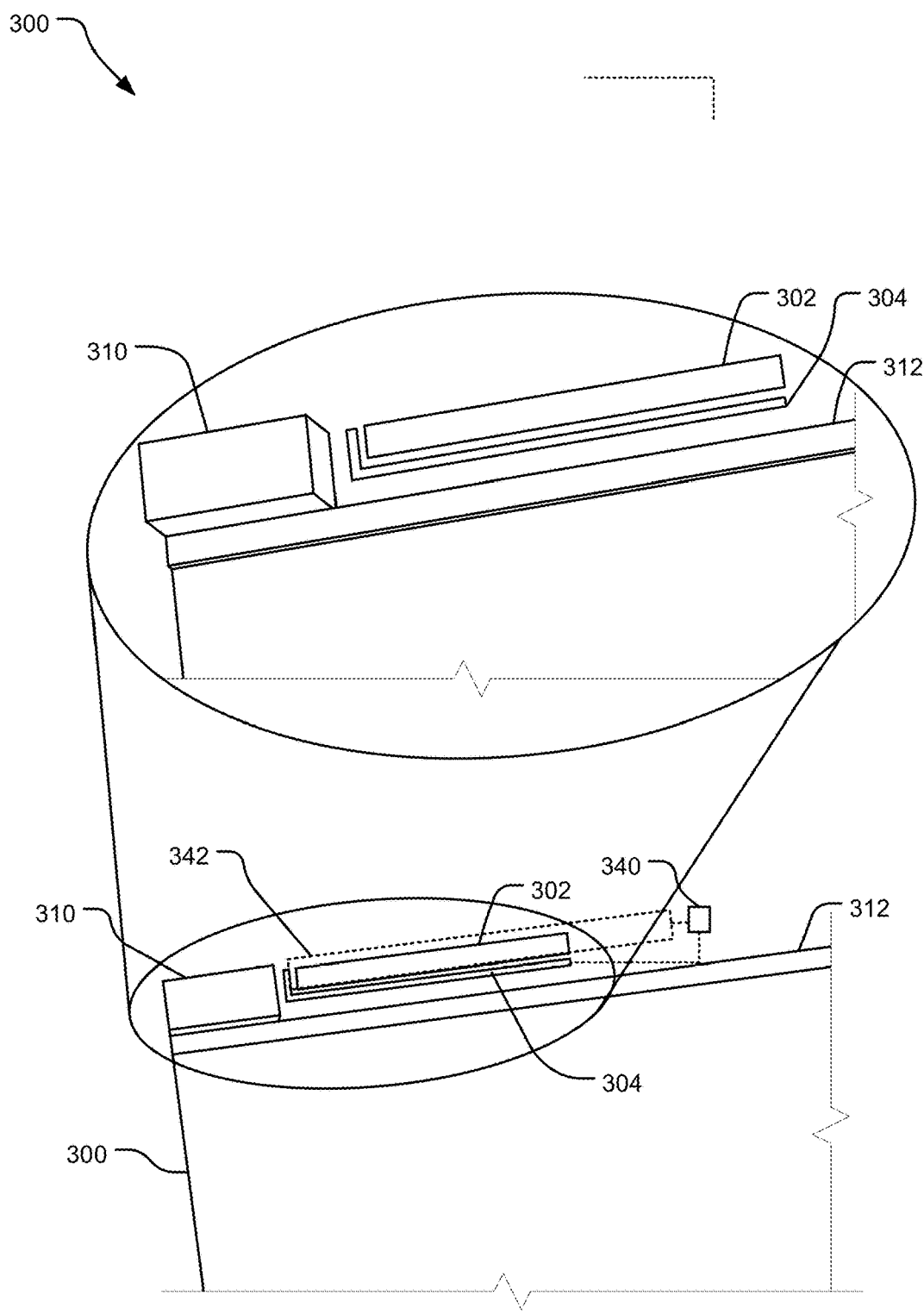
FIG. 3 illustrates another example fringing field booster for proximity sensing according to the technology disclosed herein.

FIG. 3 illustrates a computing device 300 with fringing field booster for proximity sensing according to the technology disclosed herein. Specifically, in the illustrated implementation, the computing device 300 includes a proximity sensor 302 and a booster 304. The proximity sensor 302 and the booster 304 are located near an anchor 310 near a rear left corner of the computing device 300. Furthermore, the proximity sensor 302 and the booster 304 are configured substantially parallel to a rear edge 312 of the computing device 300. In the illustrate implementation, the booster 304 may be configured as an L-shaped metal bar or a metal ink strip with a long arm substantially parallel to the rear edge 312 and a short arm substantially in the plane of the proximity sensor 302 but perpendicular to the long arm of the booster 304.

In one implementation of the computing device 300, a proximity sensor circuitry 342 that hosts the proximity sensor 302 applies the same voltage to the proximity sensor 302 and the booster 304. However, in an alternative implementation, the booster 304 may be applied a higher voltage level compared to the proximity sensor 302. For example, a voltage booster converter circuitry 340 may be used to boost voltage level received from the proximity sensor circuitry 342 that hosts the proximity sensor 302. The voltage booster converter circuitry 340 may increase the voltage applied to the booster 304 by as much as 200% compared to the voltage applied to the proximity sensor 302.

Figure 4:
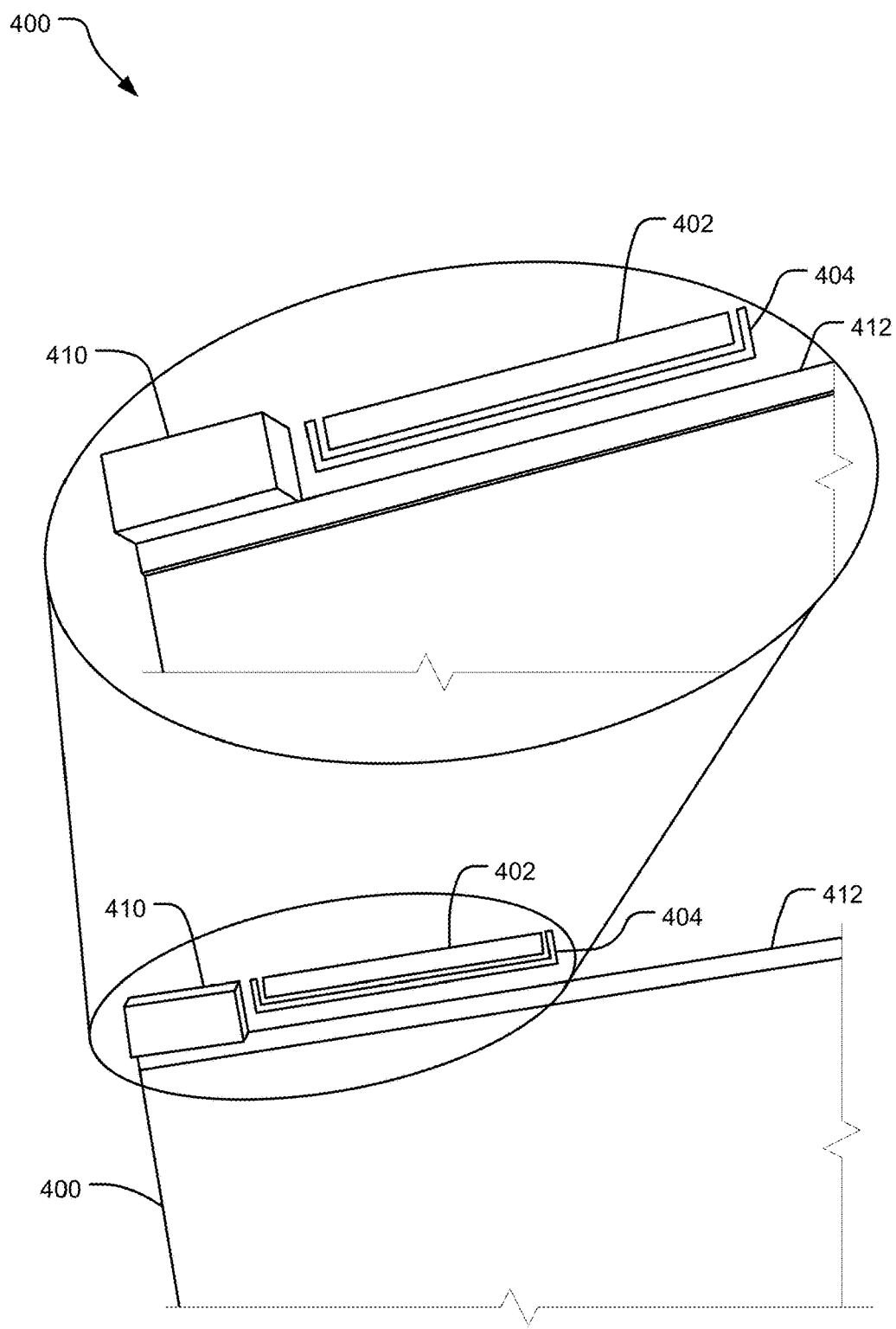
FIG. 4 illustrates another example fringing field booster for proximity sensing according to the technology disclosed herein.

FIG. 4 illustrates a computing device 400 with fringing field booster for proximity sensing according to the technology disclosed herein. Specifically, in the illustrated implementation, the computing device 400 includes a proximity sensor 402 and a booster 404. The proximity sensor 402 and the booster 404 are located near an anchor 410 near a rear left corner of the computing device 400. Furthermore, the proximity sensor 402 and the booster 404 are configured substantially parallel to a rear edge 412 of the computing device 400. In the illustrated implementation, the booster 404 may be configured as a U-shaped metal bar or a metal ink strip with a long arm substantially parallel to the rear edge 412 and two short arms each being substantially in the plane of the proximity sensor 402 but perpendicular to the long arm of the booster 404.

In one implementation of the computing device 400, a proximity sensor circuitry (such as 342 of FIG. 3) that hosts the proximity sensor 402 applies the same voltage to the proximity sensor 402 and the booster 404. However, in an alternative implementation, the booster 404 may be applied a higher voltage level compared to the proximity sensor 402 by as much as 200%. A voltage booster converter circuitry (such as the voltage booster converter circuitry 240 and 340 shown in FIGS. 2 and 3, respectively) may be used to generate the higher voltage applied to the booster 404.

Figure 5A:
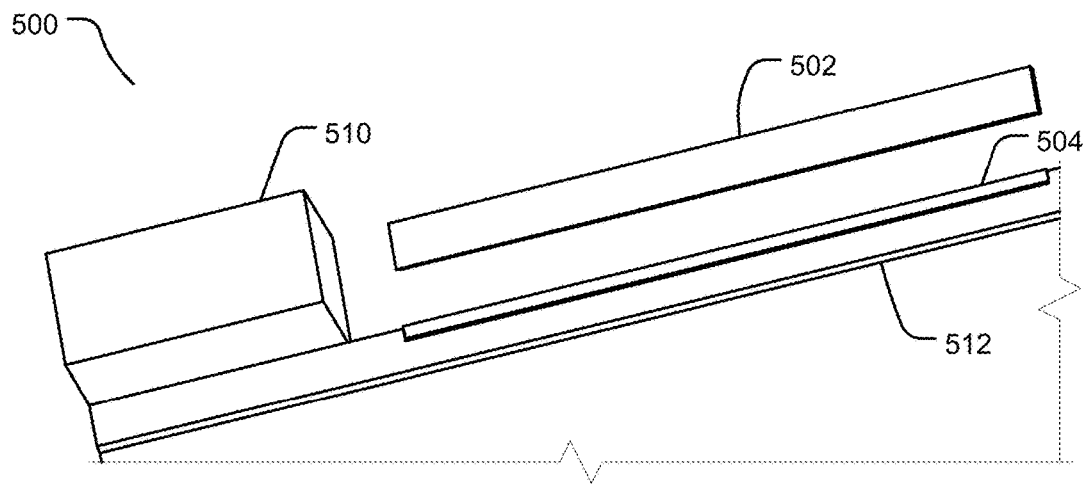
FIGS. 5A-5C illustrate another example fringing field booster for proximity sensing according to the technology disclosed herein.
Figure 5B:
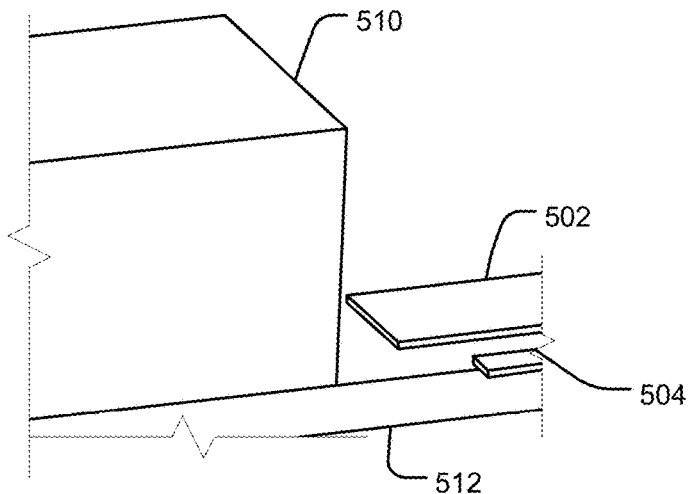
Figure 5C:
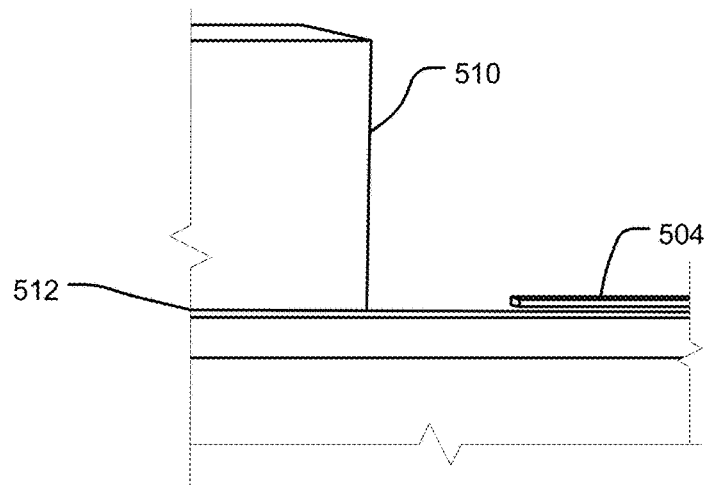

FIGS. 5A-5C illustrates a computing device 500 with fringing field booster 504 for proximity sensing according to the technology disclosed herein. Specifically, in the illustrated implementation, the computing device 500 includes a proximity sensor 502 and the booster 504. The proximity sensor 502 and the booster 504 are located near an anchor 510 near a rear left corner of the computing device 500.

Furthermore, the proximity sensor 502 and the booster 504 are configured substantially parallel to a rear edge 512 of the computing device 500. Note that in the illustrated implementation, the length of the booster 504 in the x-direction is substantially similar to the length of the proximity sensor 502 in the x-direction, in an alternative implementation, the booster 504 may be longer or shorter than the proximity sensor 502.

In one implementation of the computing device 500, a proximity sensor circuitry (such as 342 of FIG. 3) that hosts the proximity sensor 502 applies the same voltage to the proximity sensor 502 and the booster 504. However, in an alternative implementation, the booster 504 may be applied a higher voltage level compared to the proximity sensor 502 by as much as 200%. A voltage booster converter circuitry (such as the voltage booster converter circuitry 240 and 340 shown in FIGS. 2 and 3, respectively) may be used to generate the higher voltage applied to the booster 504.

Figure 6:
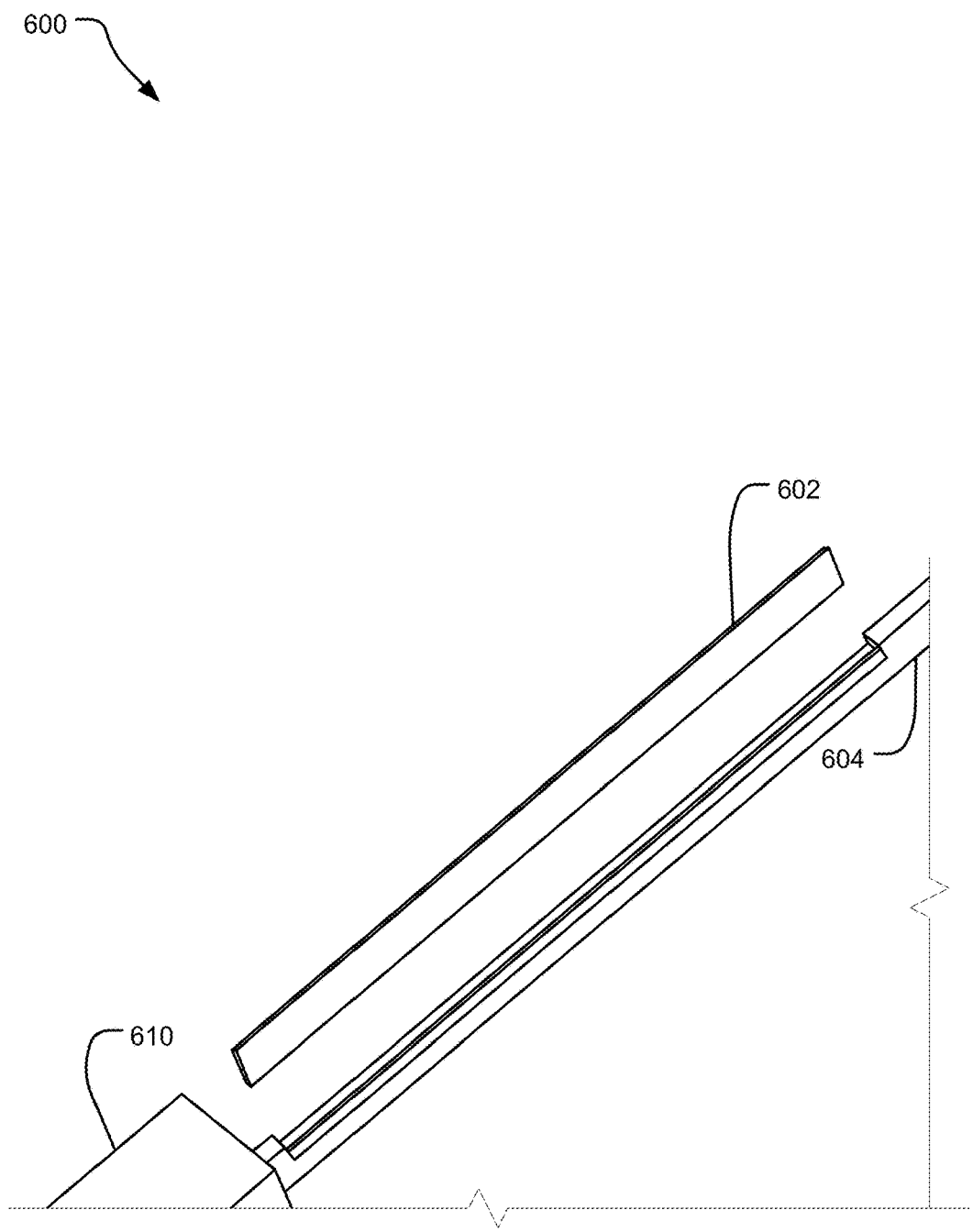
FIG. 6 illustrates another example fringing field booster for proximity sensing according to the technology disclosed herein.

FIG. 6 illustrates a computing device 600 with fringing field booster for proximity sensing according to the technology disclosed herein. Specifically, in the illustrated implementation, the computing device 600 includes a proximity sensor 602 and a booster 604. The proximity sensor 602 and the booster 604 are located near an anchor 610 near a rear left corner of the computing device 600. Furthermore, the proximity sensor 602 and the booster 604 are configured substantially parallel to a rear edge of the computing device 600. In the illustrated implementation, the booster 604 is configured to be located on the rear edge of the computing device 600. In one implementation, the booster 604 is U shaped metal strip with a long arm attached to the rear edge of the computing device 600 and two short arms at two ends of the long arm with each of the two short arms being substantially perpendicular to a plane of the computing device 600.

In one implementation of the computing device 600, a proximity sensor circuitry (such as 342 of FIG. 3) that hosts the proximity sensor 602 applies the same voltage to the proximity sensor 602 and the booster 604. However, in an alternative implementation, the booster 604 may be applied a higher voltage level compared to the proximity sensor 602 by as much as 200%. A voltage booster converter circuitry (such as the voltage booster converter circuitry 240 and 340 shown in FIGS. 2 and 3, respectively) may be used to generate the higher voltage applied to the booster 604.

Figure 7:
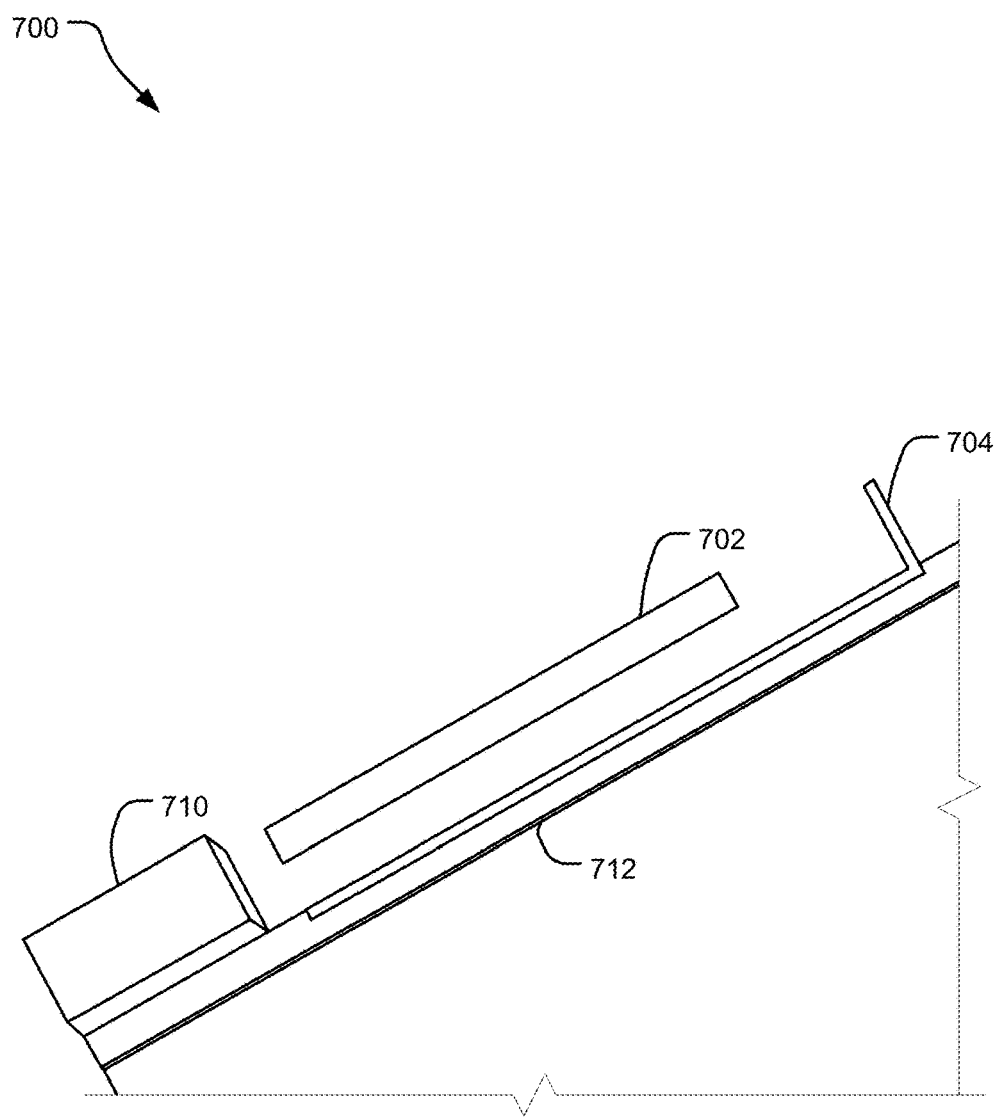
FIG. 7 illustrates another example fringing field booster for proximity sensing according to the technology disclosed herein.

FIG. 7 illustrates a computing device 700 with fringing field booster for proximity sensing according to the technology disclosed herein. Specifically, in the illustrated implementation, the computing device 700 includes a proximity sensor 702 and a booster 704. The proximity sensor 702 and the booster 704 are located near an anchor 710 near a rear left corner of the computing device 700. Furthermore, the proximity sensor 702 and the booster 704 are configured substantially parallel to a rear edge 712 of the computing device. In the illustrated implementation, the booster 704 is L-shaped with a long arm that is attached in top of the rear edge 712 of the computing device 700. Furthermore, a short arm of the booster 704 is substantially perpendicular to the rear edge 712 of the computing device 700.

In one implementation of the computing device 700, a proximity sensor circuitry (such as 342 of FIG. 3) that hosts the proximity sensor 702 applies the same voltage to the proximity sensor 702 and the booster 704. However, in an alternative implementation, the booster 704 may be applied a higher voltage level compared to the proximity sensor 702 by as much as 200%. A voltage booster converter circuitry (such as the voltage booster converter circuitry 240 and 340 shown in FIGS. 2 and 3, respectively) may be used to generate the higher voltage applied to the booster 704.

Figure 8:
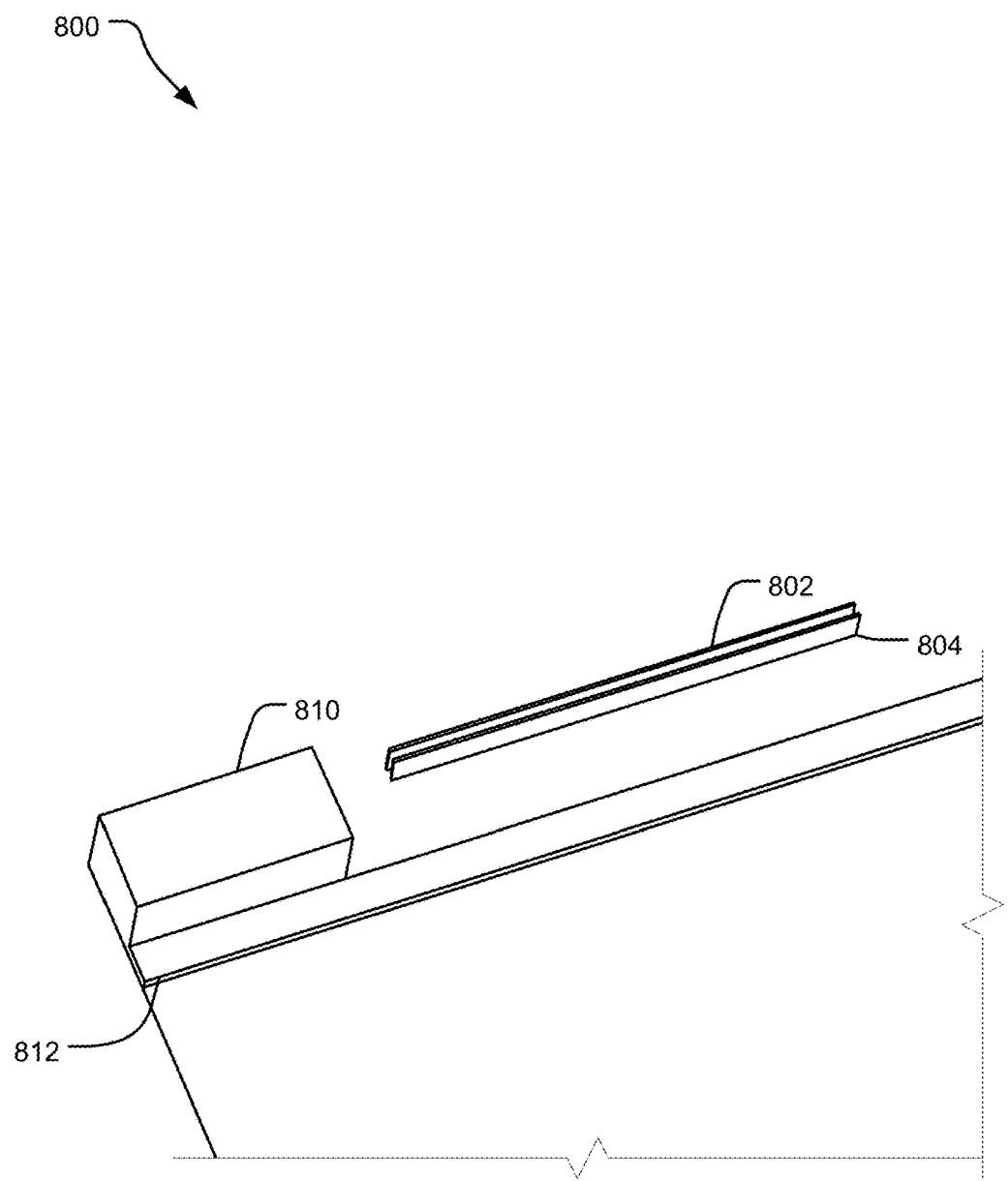
FIG. 8 illustrates another example fringing field booster for proximity sensing according to the technology disclosed herein.

FIG. 8 illustrates a computing device 800 with fringing field booster for proximity sensing according to the technology disclosed herein. Specifically, in the illustrated implementation, the computing device 800 includes a proximity sensor 802 and a booster 804. The proximity sensor 802 and the booster 804 are located near an anchor 810 near a rear left corner of the computing device 800. Furthermore, the proximity sensor 802 and the booster 804 are configured substantially parallel to a rear edge 812 of the computing device. In the illustrated implementation, each of the proximity sensor 802 and the booster 804 are configured to be of metal strips having substantially similar shape. In the illustrated implementation, both of the proximity sensor 802 and the booster 804 are located substantially near a rear edge of a keep-out zone of an RF antenna of the computing device 800. As such each of the proximity sensor 802 and the booster 804 are located away from the rear edge 812 of the computing device 800.

In one implementation of the computing device 800, a proximity sensor circuitry (such as 342 of FIG. 3) that hosts the proximity sensor 802 applies the same voltage to the proximity sensor 802 and the booster 804. However, in an alternative implementation, the booster 804 may be applied a higher voltage level compared to the proximity sensor 802 by as much as 200%. A voltage booster converter circuitry (such as the voltage booster converter circuitry 240 and 340 shown in FIGS. 2 and 3, respectively) may be used to generate the higher voltage applied to the booster 804.

Figure 9:
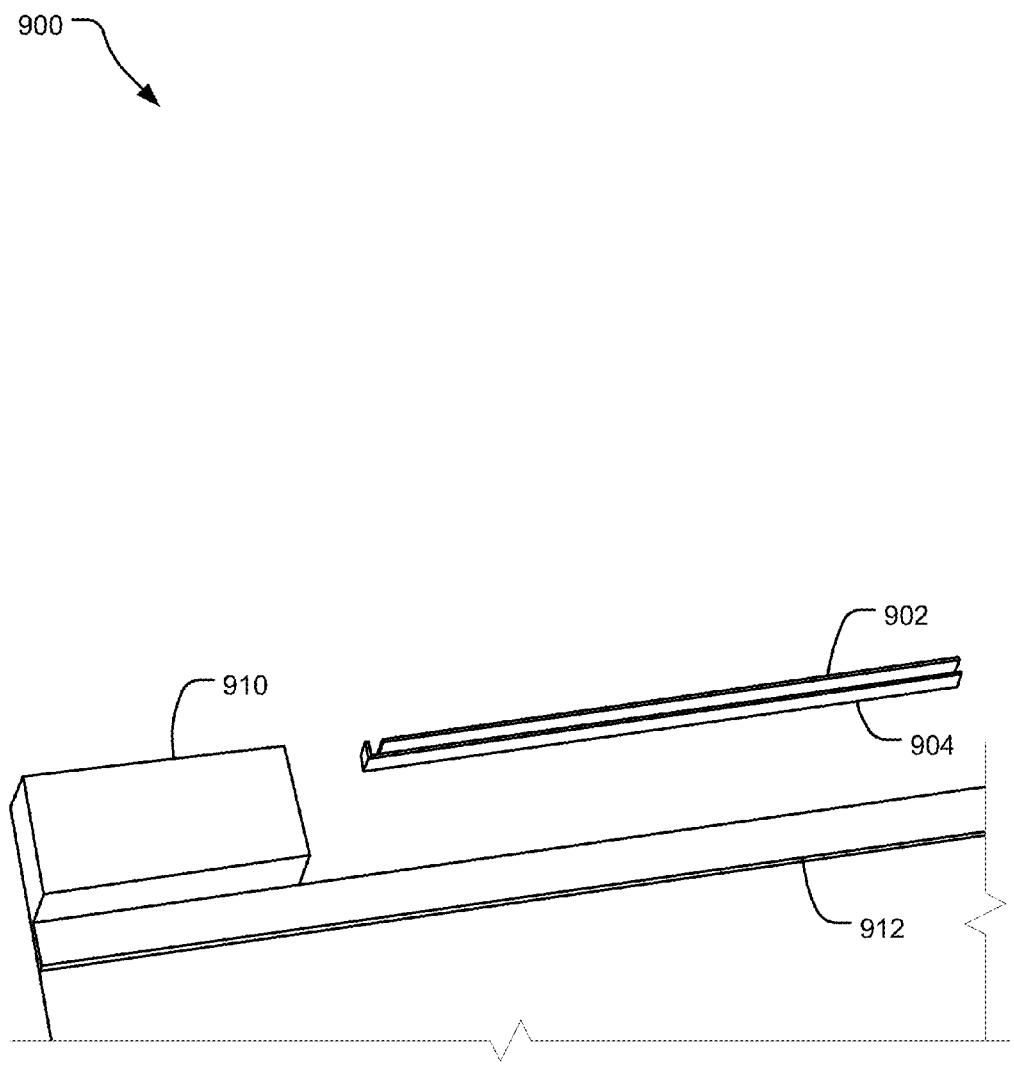
FIG. 9 illustrates another example fringing field booster for proximity sensing according to the technology disclosed herein.

FIG. 9 illustrates a computing device 900 with fringing field booster for proximity sensing according to the technology disclosed herein. Specifically, in the illustrated implementation, the computing device 900 includes a proximity sensor 902 and a booster 904. The proximity sensor 902 and the booster 904 are located near an anchor 910 near a rear left corner of the computing device 900. Furthermore, the proximity sensor 902 and the booster 904 are configured substantially parallel to a rear edge 912 of the computing device 900. In the illustrated implementation, the booster 904 is configured as an L-shaped strip closer to a rear edge of a keep-out zone of an RF antenna of the computing device 900. In the illustrated implementation, the booster 904 is L-shaped with one long arm parallel to the rear edge 912 of the computing device 900 and another short arm perpendicular to the long arm.

In one implementation of the computing device 900, a proximity sensor circuitry (such as 342 of FIG. 3) that hosts the proximity sensor 902 applies the same voltage to the proximity sensor 902 and the booster 904. However, in an alternative implementation, the booster 904 may be applied a higher voltage level compared to the proximity sensor 902 by as much as 200%. A voltage booster converter circuitry (such as the voltage booster converter circuitry 240 and 340 shown in FIGS. 2 and 3, respectively) may be used to generate the higher voltage applied to the booster 904.

Figure 10:
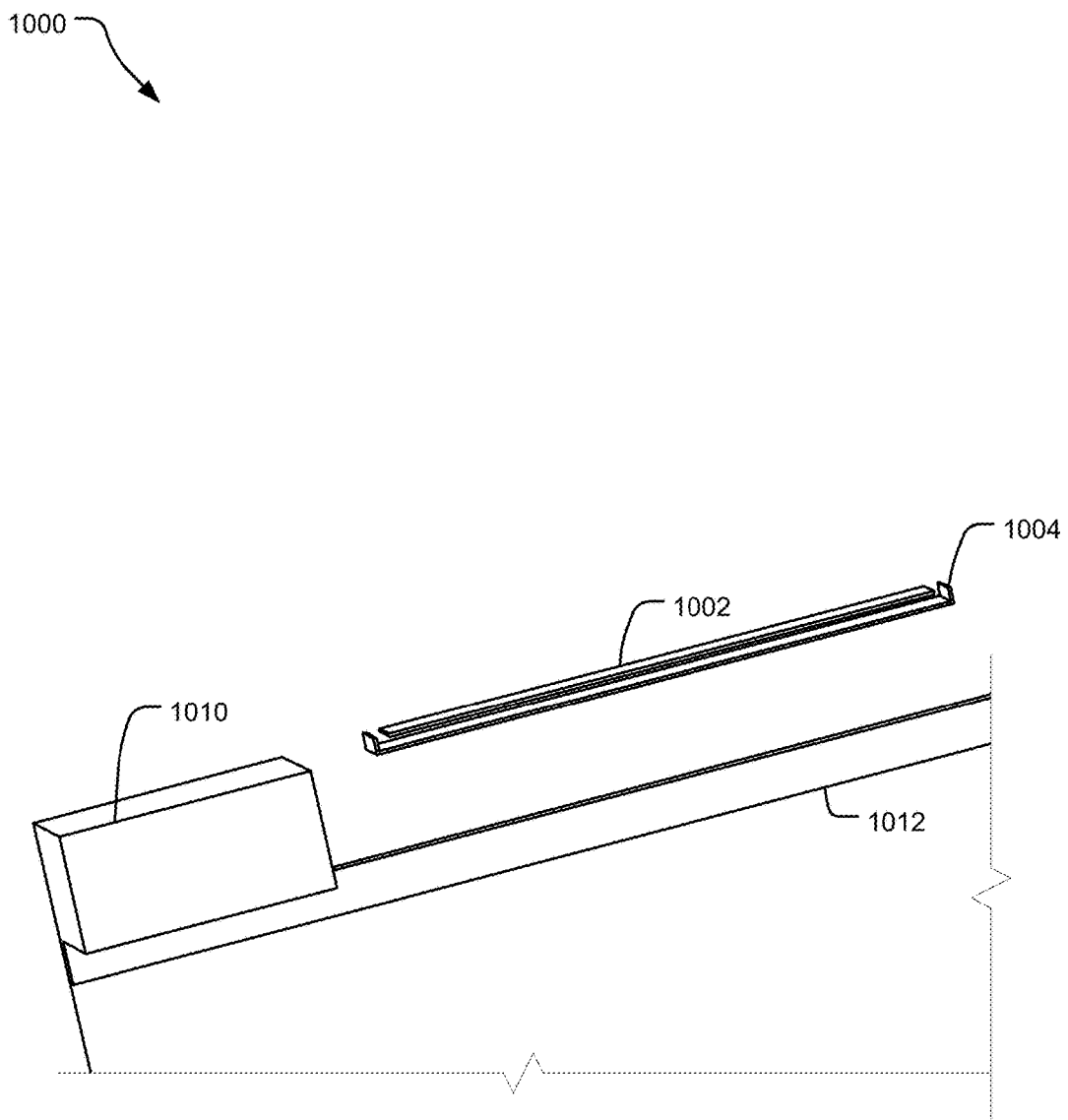
FIG. 10 illustrates another example fringing field booster for proximity sensing according to the technology disclosed herein.

FIG. 10 illustrates a computing device 1000 with fringing field booster for proximity sensing according to the technology disclosed herein. Specifically, in the illustrated implementation, the computing device 1000 includes a proximity sensor 1002 and a booster 1004. The proximity sensor 1002 and the booster 1004 are located near an anchor 1010 near a rear left corner of the computing device 1000. Furthermore, the proximity sensor 1002 and the booster 1004 are configured substantially parallel to a rear edge 1012 of the computing device. In this implementation, the booster 1004 is configured to be a U-shaped metal strip with one long arm substantially parallel to the back edge 1012 and the proximity sensor 1002. Two short arms attached at two ends of the long arm of the booster 1004 are substantially perpendicular to the long arm of the booster 1004.

In one implementation of the computing device 1000, a proximity sensor circuitry (such as 342 of FIG. 3) that hosts the proximity sensor 1002 applies the same voltage to the proximity sensor 1002 and the booster 1004. However, in an alternative implementation, the booster 1004 may be applied a higher voltage level compared to the proximity sensor 1002 by as much as 200%. A voltage booster converter circuitry (such as the voltage booster converter circuitry 240 and 340 shown in FIGS. 2 and 3, respectively) may be used to generate the higher voltage applied to the booster 1004.

Figure 11:
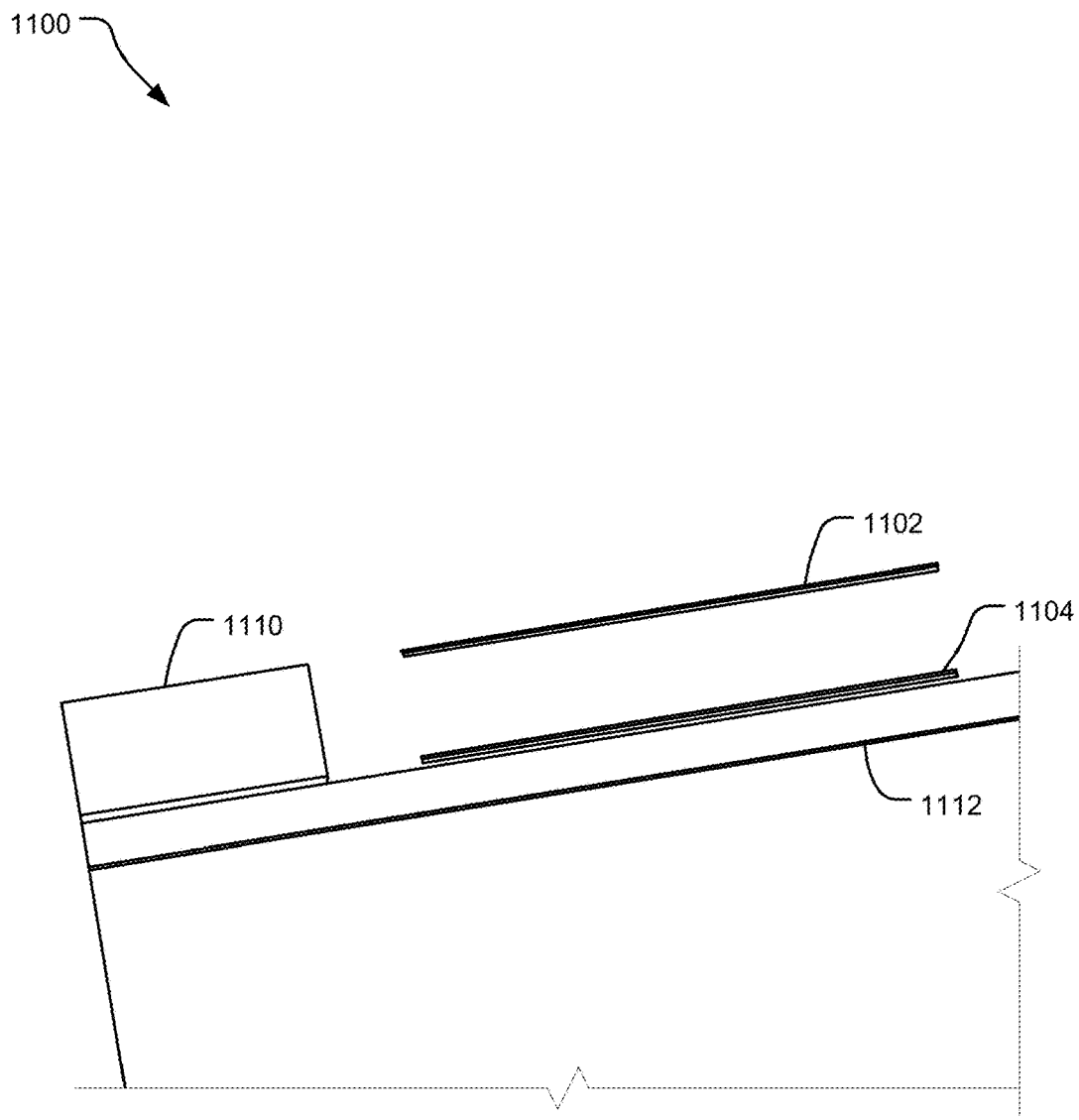
FIG. 11 illustrates another example fringing field booster for proximity sensing according to the technology disclosed herein.

FIG. 11 illustrates a computing device 1100 with fringing field booster for proximity sensing according to the technology disclosed herein. Specifically, in the illustrated implementation, the computing device 1100 includes a proximity sensor 1102 and a booster 1104. The proximity sensor 1102 and the booster 1104 are located near an anchor 1110 near a rear left corner of the computing device 1100. Furthermore, the proximity sensor 1102 and the booster 1104 are configured substantially parallel to a rear edge 1112 of the computing device. In the illustrated implementation, the proximity sensor 1102 and the booster 1104 are of substantially similar shape. However, the proximity sensor 1102 is substantially closer to a rear end of a keep-out zone of an RF antenna, whereas the booster 1104 is substantially closer to the rear edge 1112 of the computing device 1100.

In one implementation of the computing device 1100, a proximity sensor circuitry (such as 342 of FIG. 3) that hosts the proximity sensor 1102 applies the same voltage to the proximity sensor 1102 and the booster 1104. However, in an alternative implementation, the booster 1104 may be applied a higher voltage level compared to the proximity sensor 1102 by as much as 200%. A voltage booster converter circuitry (such as the voltage booster converter circuitry 240 and 340 shown in FIGS. 2 and 3, respectively) may be used to generate the higher voltage applied to the booster 1104.

Figure 12:
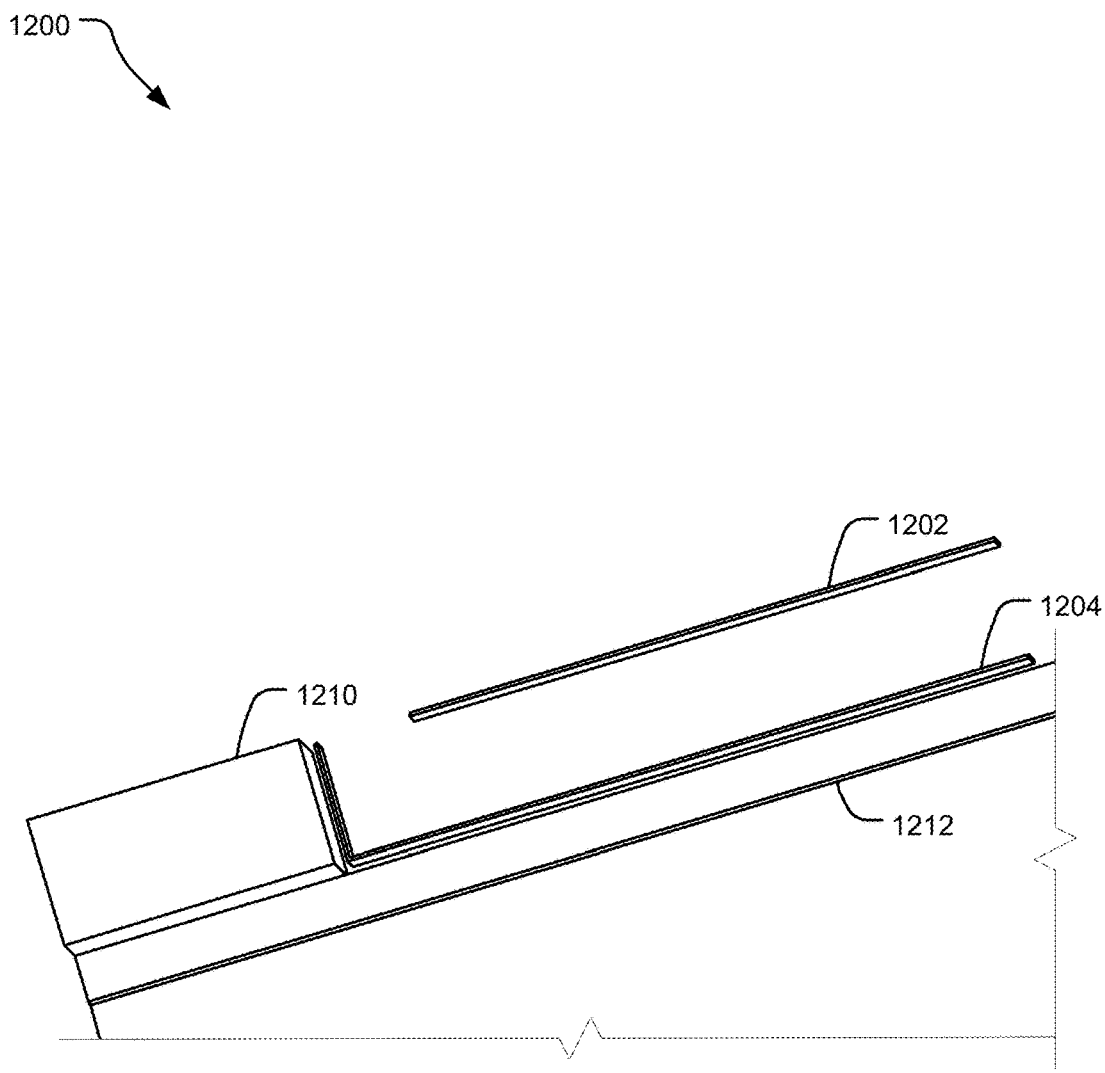
FIG. 12 illustrates another example fringing field booster for proximity sensing according to the technology disclosed herein.

FIG. 12 illustrates a computing device 1200 with fringing field booster for proximity sensing according to the technology disclosed herein. Specifically, in the illustrated implementation, the computing device 1200 includes a proximity sensor 1202 and a booster 1204. The proximity sensor 1202 and the booster 1204 are located near an anchor 1210 near a rear left corner of the computing device 1200. Furthermore, the proximity sensor 1202 and the booster 1204 are configured substantially parallel to a rear edge 1212 of the computing device. In the illustrated implementation, the booster 1204 is configured as an L-shaped metal strip with a long arm substantially closer to the rear edge 1212 whereas the proximity sensor 1202 is away from the rear edge 1212 and thus substantially closer to a rear end of an antenna keep-out zone of an RF antenna.

In one implementation of the computing device 1200, a proximity sensor circuitry (such as 342 of FIG. 3) that hosts the proximity sensor 1202 applies the same voltage to the proximity sensor 1202 and the booster 1204. However, in an alternative implementation, the booster 1204 may be applied a higher voltage level compared to the proximity sensor 1202 by as much as 200%. A voltage booster converter circuitry (such as the voltage booster converter circuitry 240 and 340 shown in FIGS. 2 and 3, respectively) may be used to generate the higher voltage applied to the booster 1204.

Figure 13:
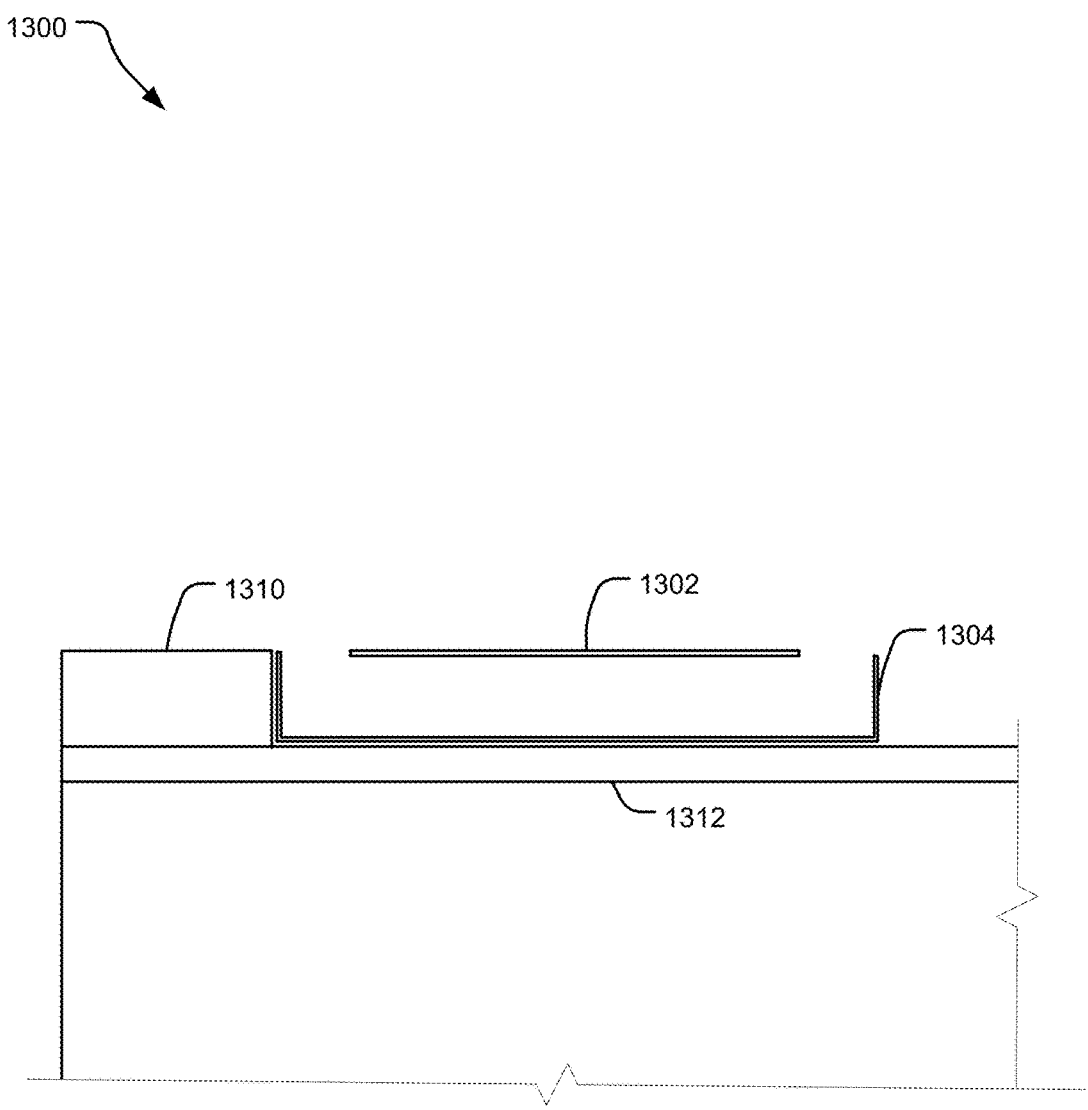
FIG. 13 illustrates another example fringing field booster for proximity sensing according to the technology disclosed herein.

FIG. 13 illustrates a computing device 1300 with fringing field booster for proximity sensing according to the technology disclosed herein. Specifically, in the illustrated implementation, the computing device 1300 includes a proximity sensor 1302 and a booster 1304. The proximity sensor 1302 and the booster 1304 are located near an anchor 1310 near a rear left corner of the computing device 1300. Furthermore, the proximity sensor 1302 and the booster 1304 are configured substantially parallel to a rear edge 1312 of the computing device. In the illustrated implementation, the booster 1304 is configured as a U-shaped metal strip with a long arm substantially closer to the rear edge 1312 and two short arms perpendicular to the long arm. Furthermore, the proximity sensor 1302 is located away from the rear edge 1312.

In one implementation of the computing device 1300, a proximity sensor circuitry (such as 342 of FIG. 3) that hosts the proximity sensor 1302 applies the same voltage to the proximity sensor 1302 and the booster 1304 are applied the same voltage. However, in an alternative implementation, the booster 1304 may be applied a higher voltage level compared to the proximity sensor 1302 by as much as 200%. A voltage booster converter circuitry (such as the voltage booster converter circuitry 240 and 340 shown in FIGS. 2 and 3, respectively) may be used to generate the higher voltage applied to the booster 1304.

An apparatus disclosed herein comprises a proximity sensor pad and a booster element located between an antenna and the proximity sensor pad, wherein voltage level of the booster element at least ten percent higher than voltage level of the proximity sensor pad. In an alternative implementation, the booster element comprises a rectangular arm extending along length of the proximity sensor pad. In one implementation, the antenna is a radio frequency (RF) antenna. In another implementation, the booster element is made of at least one of metal and metal ink. In yet another implementation, the booster element includes at least one of a metal pad having an L shape and a metal ink pad having an L shape. In another implementation, a long arm of the booster element is parallel to a long edge of the proximity sensor pad and a short arm of the booster element parallel to a short edge of the proximity sensor pad.

In an implementation of the apparatus, the booster element includes a U-shaped pad having a long arm between two short arms, the U-shaped pad made of at least one of metal and metal ink. In an alternative implementation, the long arm of the U-shaped pad is parallel to a long edge of the proximity sensor pad and two short arms of the U-shaped pad are parallel to two short edge of the proximity sensor pad. In yet another implementation, the booster is located on a rear edge of a computing device. In another implementation, the booster includes a U-shaped pad with a long arm located on a rear edge of a computing device and two short arms perpendicular to a surface of the computing device comprising keyboard of the computing device.

In one implementation of the apparatus, the booster element includes an L-shaped pad with a long arm being located on a rear edge of a computing device and a short arm being extended away from the rear edge of the computing device. In another implementation, the proximity sensor pad includes a metal sensor pad and the booster element includes a metal booster pad with each of the metal sensor pad and the metal booster pad being substantially similar in shape and size and each of the metal sensor pad and the metal booster pad being located near a rear edge of an antenna keep-out zone of the antenna, the rear edge of the antenna keep-out zone being away from a rear edge of a computing device. In yet another implementation, the proximity sensor pad includes a metal sensor pad and the booster element includes a metal booster pad with each of the metal sensor pad and the metal booster pad being substantially similar in shape and size, wherein the metal sensor pad is located near a rear edge of an antenna keep-out zone of the antenna and the metal booster pad is located near a front edge of the antenna keep-out zone, the rear edge of the antenna keep-out zone being away from a rear edge of a computing device and the front edge of the keep-out zone being near the rear edge of the computing device.

A computing device disclosed herein includes a radio-frequency (RF) antenna, a proximity sensor pad, and a booster element located between the RF antenna and the proximity sensor pad, wherein voltage level of the booster element is approximately fifty percent higher than voltage level of the proximity sensor pad. In an alternative implementation, the proximity sensor pad is a metal sensor pad and the booster element is a metal booster pad, each of the metal sensor pad and the metal booster pad configured substantially parallel to each other.

In one implementation of the computing device, the metal booster pad is L-shaped with a long arm substantially parallel to the sensor metal pad and a short arm substantially perpendicular to the metal sensor pad. In another implementation of the computing device, the metal booster pad is U-shaped with a long arm substantially parallel to the metal sensor pad two short arms substantially perpendicular to the metal sensor pad.

A proximity detector for detecting a proximity object, the proximity detector includes a proximity sensor and a booster element, wherein the booster element is located outside of an antenna keep-out zone of an antenna and wherein voltage level of the booster element is higher than voltage level of the proximity sensor between 10% and 200%. In an alternative implementation, the booster element is an L-shaped metal pad. In yet another implementation, the booster element is a U-shaped metal pad.

The implementations described herein are implemented as logical steps in one or more computer systems. The logical operations may be implemented (1) as a sequence of processor-implemented steps executing in one or more computer systems and (2) as interconnected machine or circuit modules within one or more computer systems. The implementation is a matter of choice, dependent on the performance requirements of the computer system being utilized. Accordingly, the logical operations making up the implementations described herein are referred to variously as operations, steps, objects, or modules. Furthermore, it should be understood that logical operations may be performed in any order, unless explicitly claimed otherwise or a specific order is inherently necessitated by the claim language. The above specification, examples, and data, together with the attached appendices, provide a complete description of the structure and use of exemplary implementations.

What is claimed is:

1. An apparatus comprising:
   a proximity sensor pad; and
   a booster element located between an antenna and the proximity sensor pad, wherein a voltage level of the booster element is at least ten percent higher than a voltage level of the proximity sensor pad.

2. The apparatus of claim 1, wherein the booster element comprises a rectangular arm extending along length of the proximity sensor pad.

3. The apparatus of claim 1, wherein the antenna is a radio frequency (RF) antenna.

4. The apparatus of claim 1, wherein the booster element is made of at least one of metal and metal ink.

5. The apparatus of claim 1, wherein the booster element includes at least one of a metal pad having an L shape and a metal ink pad having an L shape.

6. The apparatus of claim 5, wherein a long arm of the booster element is parallel to a long edge of the proximity sensor pad and a short arm of the booster element parallel to a short edge of the proximity sensor pad.

7. The apparatus of claim 1, wherein the booster element includes a U-shaped pad having a long arm between two short arms, the U-shaped pad made of at least one of metal and metal ink.

8. The apparatus of claim 7, wherein the long arm of the U-shaped pad is parallel to a long edge of the proximity sensor pad and two short arms of the U-shaped pad are parallel to two short edge of the proximity sensor pad.

9. The apparatus of claim 1, wherein the booster is located on a rear edge of a computing device.

10. The apparatus of claim 1, wherein the booster includes a U-shaped pad with a long arm located on a rear edge of a computing device and two short arms perpendicular to a surface of the computing device comprising keyboard of the computing device.

11. The apparatus of claim 10, wherein the booster element includes an L-shaped pad with a long arm being located on a rear edge of a computing device and a short arm being extended away from the rear edge of the computing device.

12. The apparatus of claim 1, wherein the proximity sensor pad includes a metal sensor pad and the booster element includes a metal booster pad with each of the metal sensor pad and the metal booster pad being substantially similar in shape and size and each of the metal sensor pad and the metal booster pad being located near a rear edge of an antenna keep-out zone of the antenna, the rear edge of the antenna keep-out zone being away from a rear edge of a computing device.

13. The apparatus of claim 1, wherein the proximity sensor pad includes a metal sensor pad and the booster element includes a metal booster pad with each of the metal sensor pad and the metal booster pad being substantially similar in shape and size, wherein the metal sensor pad is located near a rear edge of an antenna keep-out zone of the antenna and the metal booster pad is located near a front edge of the antenna keep-out zone, the rear edge of the antenna keep-out zone being away from a rear edge of a computing device and the front edge of the keep-out zone being near the rear edge of the computing device.

14. A computing device, comprising:
   a radio-frequency (RF) antenna;
   a proximity sensor pad; and
   a booster element located between the RF antenna and the proximity sensor pad, wherein a voltage level of the booster element is approximately fifty percent higher than a voltage level of the proximity sensor pad.

15. The computing device of claim 14, wherein the proximity sensor pad is a metal sensor pad and the booster element is a metal booster pad, each of the metal sensor pad and the metal booster pad configured substantially parallel to each other.

16. The computing device of claim 14, wherein the metal booster pad is L-shaped with a long arm substantially parallel to the sensor metal pad and a short arm substantially perpendicular to the metal sensor pad.

17. The computing device of claim 14, wherein the metal booster pad is U-shaped with a long arm substantially parallel to the metal sensor pad two short arms substantially perpendicular to the metal sensor pad.

18. A proximity detector for detecting a proximity object, the proximity detector comprising:
a proximity sensor; and
a booster element, wherein the booster element is located outside of an antenna keep-out zone of an antenna and wherein a voltage level of the booster element is between 10% and 200% higher than a voltage level of the proximity sensor.

19. The proximity detector of claim 18, wherein the booster element is an L-shaped metal pad.

20. The proximity detector of claim 18, wherein the booster element is a U-shaped metal pad.

* * * * *